(12) United States Patent
Makino et al.

(10) Patent No.: US 11,209,504 B2
(45) Date of Patent: *Dec. 28, 2021

(54) MAGNETO-RESISTIVE EFFECT ELEMENT

(71) Applicant: TDK CORPORATION, Tokyo (JP)

(72) Inventors: Kenzo Makino, Tokyo (JP); Suguru Watanabe, Tokyo (JP); Yasushi Nishioka, Tokyo (JP); Hirokazu Takahashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/896,284

(22) Filed: Jun. 9, 2020

(65) Prior Publication Data

US 2020/0300942 A1    Sep. 24, 2020

Related U.S. Application Data

(63) Continuation of application No. 15/908,066, filed on Feb. 28, 2018, now Pat. No. 10,718,828.

(30) Foreign Application Priority Data

Apr. 10, 2017    (JP) .............................. JP2017-077569

(51) Int. Cl.
*G01R 33/02*    (2006.01)
*G01R 33/09*    (2006.01)
(Continued)

(52) U.S. Cl.
CPC ......... *G01R 33/093* (2013.01); *G01R 33/072* (2013.01); *G01R 33/09* (2013.01);
(Continued)

(58) Field of Classification Search
CPC .... G01R 33/09; G01R 33/098; G01R 33/093; G01R 33/096; G01R 33/072; H01L 43/08;
(Continued)

(56) References Cited

U.S. PATENT DOCUMENTS 6,667,493 B2    12/2003  Ooshima
6,987,652 B2    1/2006   Koganei
(Continued)

FOREIGN PATENT DOCUMENTS

JP    2000-182220 A    6/2000
JP    2002-151757 A    5/2002
(Continued)

OTHER PUBLICATIONS

Oct. 15, 2019 Office Action Issued in U.S. Appl. No. 15/908,066.
Mar. 12, 2020 U.S. Notice of Allowance issued U.S. Appl. No. 15/908,066.

*Primary Examiner* — Raul J Rios Russo
(74) *Attorney, Agent, or Firm* — Oliff PLC

(57) ABSTRACT

A magneto-resistive effect element includes a magnetization free layer, an intermediate layer, and a magnetization pinned layer. The magnetization free layer extends along a first plane. The intermediate layer extends along the first plane, and is stacked on the magnetization free layer. The magnetization pinned layer extends along the first plane, and is provided on side opposite to the magnetization free layer with the intermediate layer being interposed therebetween. Here, the magnetization free layer includes an end surface that has a maximum inclination angle of 42° or less relative to the first plane.

9 Claims, 8 Drawing Sheets

(51) Int. Cl.
  *H01L 43/08* (2006.01)
  *G01R 33/07* (2006.01)
  *H01L 43/04* (2006.01)
  *H01L 43/06* (2006.01)

(52) U.S. Cl.
  CPC ......... *G01R 33/096* (2013.01); *G01R 33/098* (2013.01); *H01L 43/04* (2013.01); *H01L 43/065* (2013.01); *H01L 43/08* (2013.01); *H01L 2224/48091* (2013.01); *H01L 2924/00014* (2013.01); *H01L 2924/181* (2013.01)

(58) Field of Classification Search
  CPC . H01L 2224/48091; H01L 2924/00014; H01L 2924/181; H01L 43/04; H01L 43/065
  USPC ...... 324/51, 55, 200, 207.21, 227, 228, 244, 324/252
  See application file for complete search history.

(56) References Cited

U.S. PATENT DOCUMENTS

| | | |
|---|---|---|
| 7,859,799 B2 | 12/2010 | Watanabe et al. |
| 8,378,674 B2 | 2/2013 | Furukawa et al. |
| 2006/0098356 A1* | 5/2006 | Hoshino ................ B82Y 25/00 360/324.11 |
| 2006/0203397 A1* | 9/2006 | Mizuno ................ G11B 5/3929 360/324.11 |
| 2009/0141410 A1 | 6/2009 | Jogo et al. |
| 2011/0317313 A1* | 12/2011 | Miyauchi ............... B82Y 25/00 360/245.3 |
| 2014/0292321 A1* | 10/2014 | Yamazaki ........... G01R 33/093 324/252 |
| 2014/0293475 A1* | 10/2014 | Degawa ............... G11B 5/3912 360/75 |
| 2018/0275216 A1* | 9/2018 | Tanaka ................ G01R 33/098 |

FOREIGN PATENT DOCUMENTS

| | | |
|---|---|---|
| JP | 2003-110162 A | 4/2003 |
| JP | 2003-133614 A | 5/2003 |
| JP | 2007-220154 A | 8/2007 |
| JP | 2008-159697 A | 7/2008 |
| JP | 2009-140952 A | 6/2009 |
| WO | 2008/146809 A1 | 12/2008 |

* cited by examiner

MAGNETO-RESISTIVE EFFECT ELEMENT

CROSS REFERENCE TO RELATED APPLICATIONS

This is a Continuation of application Ser. No. 15/908,066 filed Feb. 28, 2018, which claims the benefit of Japanese Priority Patent Application JP 2017-077569 filed on Apr. 10, 2017. The disclosures of the prior applications are hereby incorporated by reference herein in their entireties.

BACKGROUND

The disclosure relates to a magneto-resistive effect element that includes a magnetization free layer.

As a magnetic field detection device that detects an external magnetic field, a magnetic field detection device utilizing a Hall element or a magneto-resistive effect element has been known. For example, reference is made to International Publication No. WO 2008/146809.

SUMMARY

It has been requested to improve accuracy in detection of a magnetic field in a magnetic field detection device.

It is desirable to provide a magneto-resistive effect element that includes a magnetization free layer with a lower saturating magnetic field.

A magneto-resistive effect element according to an embodiment of the disclosure includes: a magnetization free layer that extends along a first plane; an intermediate layer that extends along the first plane, and is stacked on the magnetization free layer; and a magnetization pinned layer that extends along the first plane, and is provided on side opposite to the magnetization free layer with the intermediate layer being interposed therebetween. Here, the magnetization free layer includes an end surface that has a maximum inclination angle of 42° or less relative to the first plane.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
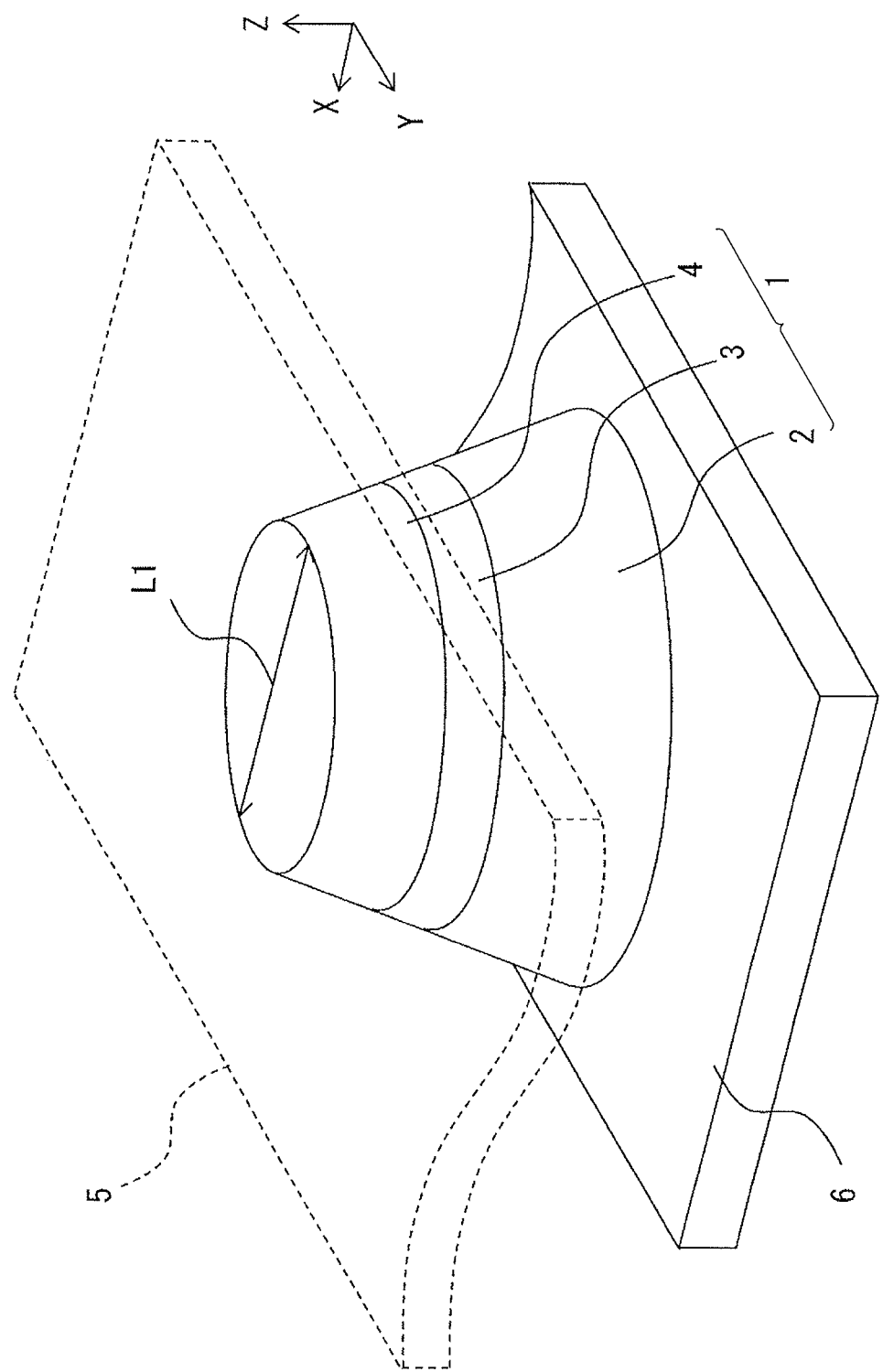
FIG. 1 is a perspective view of an overall configuration of a magneto-resistive effect device that includes a magneto-resistive effect element according to an embodiment of the disclosure.

Some embodiments of the disclosure are described below in detail with reference to the accompanying drawings.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. One Example Embodiment
2. Experimental Examples
3. Other Modification Examples

[1. One Example Embodiment]

[Configuration of Magneto-Resistive Effect Device]

FIG. 1 is a perspective view of a magneto-resistive effect device according to an embodiment of the disclosure. The magneto-resistive effect device may include, for example, a magneto-resistive effect element 1, an upper electrode 5, and a lower electrode 6.

The magneto-resistive effect device may detect, for example, presence or absence of an external magnetic field and intensity of the external magnetic field. The external magnetic field may be a detection target magnetic field that influences the magneto-resistive effect device itself. The magneto-resistive effect device may be mounted on, for example, an electronic compass, an angle detection sensor, or any other device that detects presence or absence and intensity of the external magnetic field. A direction in which the external magnetic field is applied may be an X-axis direction, for example.

The upper electrode 5 and the lower electrode 6 may be a pair of electrodes that each extend both in the X-axis direction and a Y-axis direction. The upper electrode 5 and the lower electrode 6 may be provided to interpose the magneto-resistive effect element 1 in a direction in which layers are stacked (e.g., in a Z-axis direction). The layers may configure the magneto-resistive effect element 1. That is, the upper electrode 5 and the lower electrode 6 may serve to supply a signal current to the magneto-resistive effect element 1 in a direction intersecting a surface of each of the layers that configure the magneto-resistive effect element 1. The intersecting direction may be, for example, a direction that is perpendicular to the surface of each of the layers (i.e., a thickness direction) that configure the magneto-resistive effect element 1. In one embodiment, the upper electrode 5 and the lower electrode 6 may be each configured by, for example, a single-layer film or a stacked-layer film. The single-layer film may contain, as a main material, aluminum (Al), tantalum (Ta), copper (Cu), gold (Au), a gold-copper alloy (AuCu), or ruthenium (Ru). The stacked-layer film may be configured by two or more stacked single-layer films each containing the above material as the main material. It is to be noted that an X-Y plane is a specific but non-limiting example corresponding to a "first plane" of the disclosure.

The magneto-resistive effect element 1 may include a stacked body in which, for example, a magnetization pinned layer 2, an intermediate layer 3, and a magnetization free layer 4 are stacked in order on the lower electrode 6.

The magnetization pinned layer 2 may contain, for example, a ferromagnetic material as a main material, and its magnetization direction is pinned in substantially one direction. In one embodiment, non-limiting examples of the ferromagnetic material contained in the magnetization pinned layer 2 may include a high-spin-polarizability material such as a simple substance including iron (Fe), cobalt (Co), and nickel (Ni), as well as a nickel-iron alloy, an iron-cobalt alloy, and an iron-cobalt-boron (B) alloy. Selection of such a high-spin-polarizability material allows for obtainment of a high magneto-resistance change rate in the magneto-resistive effect element 1.

Further, non-limiting examples of the ferromagnetic material that configures the magnetization pinned layer 2 may include cobalt (CO), a cobalt-chromium-based (Co—Cr-based) alloy, a cobalt (CO) multi-layer, a cobalt-chromium-platinum-based (Co—Cr—Pt-based) alloy, an iron-platinum-based (Fe—Pt-based) alloy, a samarium-cobalt-based (Sm—Co-based) alloy including a rare earth element, and a terbium-iron-cobalt-based (Tb—Fe—Co-based) alloy including a rare earth element. The magnetization pinned layer 2 that contains the ferromagnetic material as a main constituent material has magnetization pinned along a normal direction of a film surface. Non-limiting examples of the ferromagnetic material that configures the magnetization pinned layer 2 having magnetization pinned along the normal direction of the film surface may include, besides those mentioned above, a cobalt/platinum (Co/Pt) artificial lattice film, a cobalt/palladium (Co/Pd) artificial lattice film, an iron/palladium (Fe/Pd) artificial lattice film, and iron boride (FeB). The magnetization pinned layer 2 may also contain a Heusler alloy as a main material. The magnetization pinned layer 2 may have a film thickness of about 1 nm to about 10 nm, for example. In order to stabilize the magnetization of the magnetization pinned layer 2, an antiferromagnetic layer may be further provided to be in contact with a surface, of the magnetization pinned layer 2, opposite to the intermediate layer 3. In an alternative embodiment, magnetization anisotropy caused by a crystal structure or a shape may be utilized to stabilize the magnetization of the magnetization pinned layer 2. Non-limiting examples of a constituent material of such an antiferromagnetic layer may include ferrous oxide (FeO), cobaltous oxide (CoO), nitric oxide (NiO), chalcopyrite ($CuFeS_2$), iridium manganese (IrMn), ferrous manganese (FeMn), platinum manganese (PtMn), chromium (Cr), and manganese (Mn).

The magnetization pinned layer 2 may have a synthetic structure including a pair of ferromagnetic films and a non-magnetic electrically conductive film interposed therebetween, in which the pair of ferromagnetic films are antiferromagnetically coupled together. In this case, the magnetization pinned layer 2 may have a self-pinned structure in which the magnetization of the magnetization pinned layer 2 is stabilized, without using the antiferromagnetic layer, by adjusting the respective thicknesses of the pair of ferromagnetic films and the thickness of the non-magnetic electrically conductive film interposed therebetween.

The intermediate layer 3 may be interposed between the magnetization pinned layer 2 and the magnetization free layer 4. The magneto-resistive effect element 1 obtains a magneto-resistive effect through an interaction between the magnetization of the magnetization pinned layer 2 and magnetization of the magnetization free layer 4 via the intermediate layer 3. The intermediate layer 3 may be configured by a layer that includes an electric conductor, an insulator, or a semiconductor. In an alternative embodiment, the intermediate layer 3 may include a layer (i.e., a current confinement layer) that includes, in an insulator, an electrically conductive point configured by a conductor.

Non-limiting examples of a non-magnetic electrically conductive material to be applied to the intermediate layer 3 may include copper (Cu), silver (Ag), gold (Au), and ruthenium (Ru). In a case where the intermediate layer 3 is configured by such a non-magnetic electrically conductive material, the magneto-resistive effect element 1 exhibits a giant magneto-resistive (GMR) effect. In this case, the film thickness of the intermediate layer 3 may be set to about 0.5 nm to about 3.5 nm, for example.

Non-limiting examples of a non-magnetic insulating material to be applied to the intermediate layer 3 may include alumina ($Al_2O_3$) and magnesium oxide (MgO). In a case where the intermediate layer 3 is configured by such a non-magnetic insulating material, the magneto-resistive effect element 1 exhibits a tunneling magneto-resistive (TMR) effect. In this case, the film thickness of the intermediate layer 3 may be so adjusted as to exhibit a coherent tunneling effect between the magnetization pinned layer 2 and the magnetization free layer 4. The film thickness of the intermediate layer 3 may be set to about 0.5 nm to about 3.5 nm, for example.

Non-limiting examples of a non-magnetic semiconductor material to be applied to the intermediate layer 3 may include zinc oxide (ZnO), indium(III) oxide ($In_2O_3$), stannic oxide ($SnO_2$), indium tin oxide (ITO), gallium oxide ($GaO_x$), and gallium oxide ($Ga_2O_x$). In this case, the film thickness of the intermediate layer 3 may be set to about 1.0 nm to about 4.0 nm, for example, in one embodiment.

In one embodiment, the current confinement layer to be applied to the intermediate layer 3 may have a structure provided with the electrically conductive point that is configured by a conductor in the non-magnetic insulator made of $Al_2O_3$ or MgO, for example. Non-limiting examples of the conductor may include cobalt iron (CoFe), cobalt iron boride (CoFeB), cobalt iron silicon (CoFeSi), cobalt manganese germanium (CoMnGe), cobalt manganese silicon (CoMnSi), cobalt manganese aluminum (CoMnAl), iron (Fe), cobalt (Co), gold (Au), copper (Cu), aluminum (Al), and magnesium (Mg). In this case, the film thickness of the intermediate layer 3 may be set to about 0.5 nm to about 2.0 nm, for example, in one embodiment.

The magnetization free layer 4 has a magnetization direction that varies depending on an externally applied magnetic field or a spin-polarized electron. The magnetization free layer 4 may be configured by a ferromagnetic material. Non-limiting examples of the ferromagnetic material that configures the magnetization free layer 4 may include nickel iron (NiFe), cobalt iron (CoFe), cobalt iron boride (CoFeB), cobalt iron silicon (CoFeSi), cobalt manganese germanium (CoMnGe), cobalt manganese silicon (CoMnSi), and cobalt manganese aluminum (CoMnAl). In a case where such a ferromagnetic material is contained as a main constituent material, the magnetization free layer 4 has a magnetization easy axis along an intra-film surface direction. The magnetization free layer 4 may have a thickness of about 1 nm to about 20 nm, for example. The magnetization free layer 4 may have a thickness in a range from 6 nm to 13 nm, in one embodiment.

Figure 2:
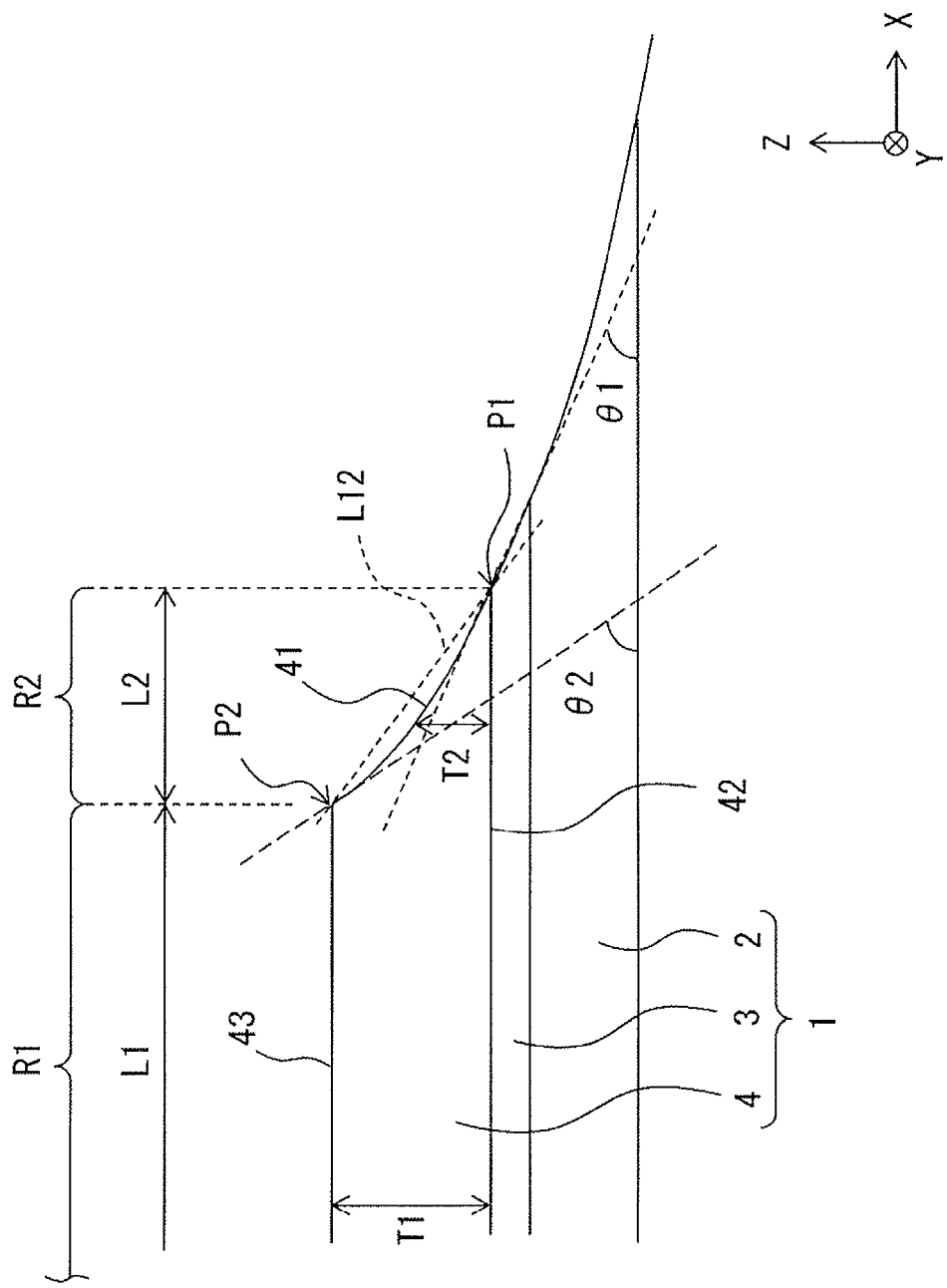
FIG. 2 is a schematic diagram illustrating a cross-sectional shape of a part of the magneto-resistive effect element illustrated in FIG. 1.

As illustrated in FIG. 2, the magnetization free layer 4 includes an end surface 41 that has a maximum inclination angle $\theta 2$ of 42° or less relative to the X-Y plane. Further, the end surface 41 has a minimum inclination angle $\theta 1$ of 25° or less relative to the X-Y plane. In a specific but non-limiting example, the end surface 41 has the minimum inclination angle $\theta 1$ of 25° or less ($\leq 25°$) relative to the X-Y plane at a position P1. The position P1 may be a position at which the end surface 41 and a bottom surface 42 intersect each other. The end surface 41 has the maximum inclination angle $\theta 2$ of 42° or less ($\leq 42°$) relative to the X-Y plane at a position P2. The position P2 may be a position at which the end surface 41 and a top surface 43 intersect each other. Further, the magnetization free layer 4 further includes a flat part R1 that has a substantially constant thickness T1, and an inclined part R2 that includes the end surface 41 and has a thickness T2. The thickness T2 decreases as being away from the flat part R1. FIG. 2 is a schematic diagram illustrating a cross-sectional shape of a part of the magneto-resistive effect element illustrated in FIG. 1. In a case where the flat part R1 has a length L1 of 6 μm or less, for example, in a direction of a detection target magnetic field along the X-Y plane, i.e., in the X-axis direction, effects of inclining the end surface 41 of the magnetization free layer 4 become remarkable as described later.

The magnetization free layer 4 satisfies the following conditional expression (1).

$$L2*(L1)^2 \geq 0.4 \qquad (1)$$

where L1 denotes a length of the flat part R1 of the magnetization free layer 4 along the X-Y plane, and L2 denotes a length of the inclined part R2 of the magnetization free layer 4 along the X-Y plane.

The magnetization free layer 4 may further include the bottom surface 42 that extends along the X-Y plane and faces the intermediate layer 3, and the top surface 43 that extends along the X-Y plane and is positioned opposite to the intermediate layer 3. A part, of the end surface 41, between the position P1 and the position P2 may be recessed from a position on a linear line L12 that connects the position P1 and the position P2 on a Y-Z plane that is orthogonal to the X-Y plane, as illustrated in FIG. 2. The position P1 may be a position at which the end surface 41 and the bottom surface 42 intersect each other, and the position P2 may be a position at which the end surface 41 and the top surface 43 intersect each other. In other words, the end surface 41 may have a concave shape relative to the outside. The end surface 41 having such a concave shape causes an inclination angle near the position P1, of the end surface 41, close to the intermediate layer 3 to be smaller than an inclination angle of another part (e.g., near the position P2) of the end surface 41. Thus, it becomes possible to more effectively reduce hysteresis of an output caused by shape anisotropy of the magnetization free layer 4 near the intermediate layer 3.

A cap layer, a seed layer, or a buffer layer may be interposed between the upper electrode 5 and the magneto-resistive effect element 1 as well as between the lower electrode 6 and the magneto-resistive effect element 1. Non-limiting examples of each of the cap layer, the seed layer, and the buffer layer may include a single-layer film made of ruthenium (Ru), tantalum (Ta), copper (Cu), or chromium (Cr), for example, and a stacked-layer film configured by a plurality of stacked single-layer films. In one embodiment, each of the cap layer, the seed layer, and the buffer layer may have a film thickness of about 1 nm to about 20 nm.

Although FIG. 1 exemplifies a case where the magneto-resistive effect element 1 has a frustum shape and the magnetization free layer 4 has a circular shape (i.e., a planar shape) along the X-Y plane, the planar shape of the magnetization free layer 4 is not particularly limited thereto. The planar shape of the magnetization free layer 4 may also be an elliptical shape or a quadrangular shape, for example.

[Workings and Effects of Magneto-Resistive Effect Device]

Figure 3A:
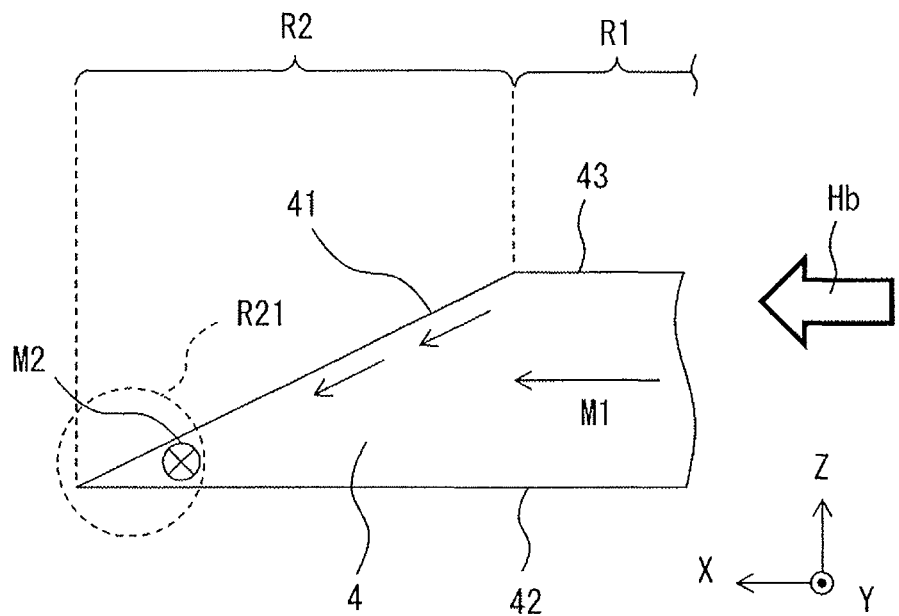
FIG. 3A is a schematic cross-sectional view of a magnetization free layer illustrated in FIG. 1 with a state of magnetization.
Figure 3B:
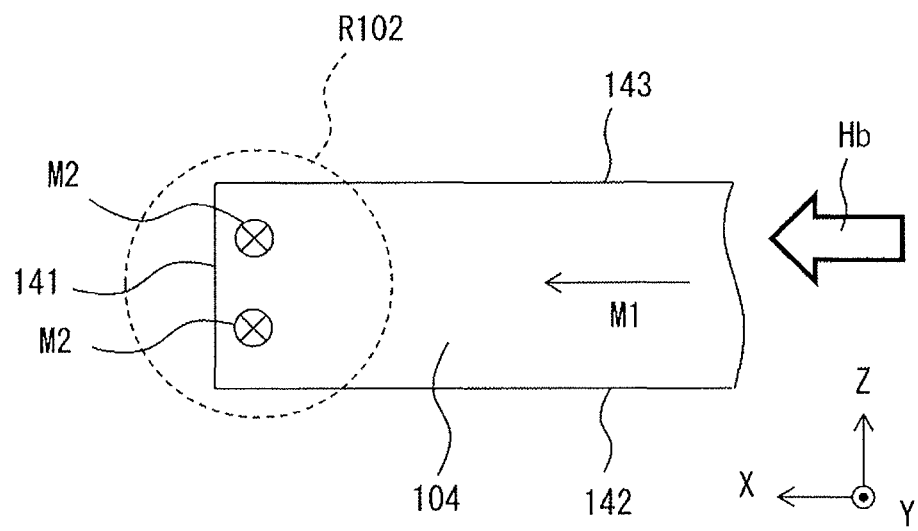
FIG. 3B is a schematic cross-sectional view of a magnetization free layer as a reference example with a state of magnetization.
Figure 4A:
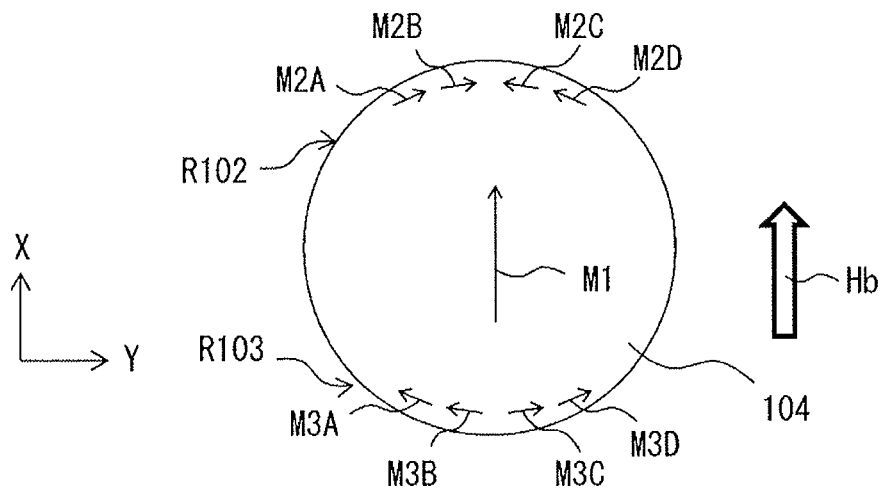
FIG. 4A is a first schematic plan view of the magnetization free layer illustrated in FIG. 3B with a state of magnetization.
Figure 4B:
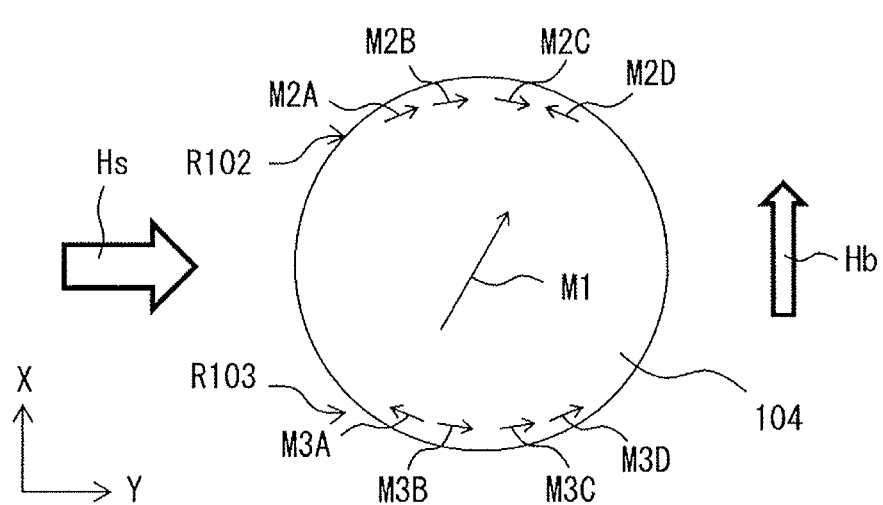
FIG. 4B is a second schematic plan view of the magnetization free layer illustrated in FIG. 3B with a state of magnetization.
Figure 4C:
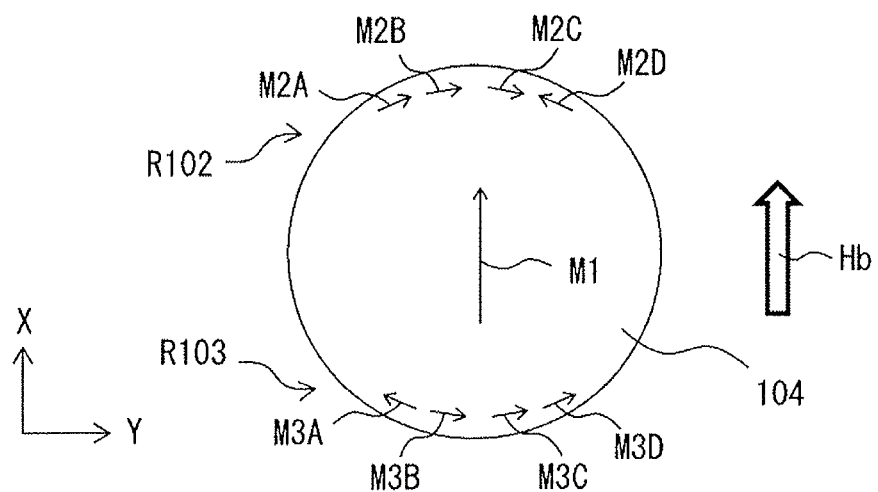
FIG. 4C is a third schematic plan view of the magnetization free layer illustrated in FIG. 3B with a state of magnetization.

Description is give next of workings and effects of the magneto-resistive effect device, with reference to FIGS. 3A and 3B as well as to FIGS. 4A to 4C. FIG. 3A is an enlarged cross-sectional view of a vicinity of the end surface 41 of the magnetization free layer 4 in the magneto-resistive effect element 1, and schematically illustrates distribution of magnitude of magnetization and a direction of the magnetization along an X-Z cross-section. FIG. 3B is an enlarged cross-sectional view of a vicinity of an end surface 141 of a magnetization free layer 104, as a reference example, having a constant thickness. FIGS. 4A to 4C each schematically illustrate distribution of magnitude of magnetization and a direction of the magnetization in the X-Y plane of the magnetization free layer 104 as a reference example. In FIGS. 3A and 3B as well as in FIGS. 4A to 4C, a length of an arrow indicates magnitude of magnetization, and a direction of the arrow indicates a direction of the magnetization.

The magneto-resistive effect device may be used with a bias magnetic field Hb being applied in +X direction, for example. FIGS. 3B and 4A each illustrate the magnetization free layer 104 in the X-Y plane with a state of magnetization, for example, in a case where only the bias magnetic field Hb in the +X direction is applied and a detection target magnetic field Hs is zero (0). In this case, the magnetization free layer 104 has, as a main magnetization component, magnetization M1 in substantially the same direction (+X direction) as that of the bias magnetic field Hb. The main magnetization component may also be considered as a total sum of all spins in the magnetization free layer 104. However, in both ends R102 and R103 in the X-axis direction, for example, there are magnetizations M2 (M2A to M2D) and magnetizations M3 (M3A to M3D) along the end surface 141, due to shape anisotropy of the magnetization free layer 104. In FIG. 4A, the magnetizations M2A to M2D have substantially the same magnitudes as those of the magnetizations M3A to M3D, respectively. The magnetizations M2A, M2B, M3C, and M3D are oriented substantially in +Y direction, and the magnetizations M2C, M2D, M3A, and M3B are oriented substantially in −Y direction.

When the detection target magnetic field Hs is applied in the +Y direction, for example, the magnetization M1 oriented in the +X direction becomes slightly inclined in the +Y direction, as illustrated in FIG. 4B. Further, the magnetization M2C and the magnetization M3B each oriented substantially in −Y direction become reversed to be oriented substantially in the +Y direction. When the application of the detection target magnetic field Hs is stopped afterward, the magnetization M1 slightly inclined to the +Y direction from the +X direction returns to the +X direction along the bias magnetic field Hb, as illustrated in FIG. 4C. However, there may be a case where the magnetization M2C and the magnetization M3B are kept oriented substantially in the +Y direction. In this case, the magnetization M2C and the magnetization M3B influence a direction of an overall magnetization of the magnetization free layer 104 as magnetization components that do not follow the detection target magnetic field Hs, thus resulting in an error in an output signal.

Accordingly, in the present example embodiment, an end of the magnetization free layer 4 is set as the inclination part R2, and is designed to be gradually thinner in its thickness as being closer to a tip part R21, as illustrated in FIG. 3A. However, the magnetization free layer 104 as a reference example illustrated in FIG. 3B has a substantially constant thickness up to the end surface 141. This causes more magnetization M2 (or M3) oriented in a direction different from that of the bias magnetic field Hb to be present in the end R102 (or R103) near the end surface 141. In contrast, the magnetization free layer 4 of the present example embodiment includes the inclined part R2 at its end, thus allowing for reduction in an area to be influenced by the shape anisotropy. This makes it possible to reduce rate of the magnetization M2 (or M3) present in the entire magnetization free layer 4, as compared with rate of the magnetization M2 (or M3) present in the magnetization free layer 104. As a result, it becomes possible for the magneto-resistive effect element 1 including the magnetization free layer 4 to reduce the magnetization component that does not follow the detection target magnetic field Hs, as compared with the case of including the magnetization free layer 104, thus allowing for reduction in the error in an output signal.

In the present example embodiment, the magnetization free layer 4 thus includes the end surface 41 that is inclined relative to the X-Y plane in which the magnetization free layer 4 extends. This alleviates the influence of the shape anisotropy of the magnetization free layer 4, making it possible to reduce magnetostatic energy of the end surface 41 and thus to reduce an amount of magnetization, positioned near the end surface 41, which is less likely to follow the detection target magnetic field Hs. As a result, it becomes possible to achieve a lower saturating magnetic field in the magnetization free layer 4, and thus to reduce the error in an output signal supplied from the magneto-resistive effect element 1. In particular, in a case where the flat part R1 has a length L1 of 6 μm or less as illustrated in FIG. 1 in a direction of the detection target magnetic field along the X-Y plane, i.e., in the X-axis direction, the above-described effects of inclining the end surface 41 of the magnetization free layer 4 become remarkable.

Further, in the present example embodiment, the magnetization free layer 4 satisfies the conditional expression (1), where L1 denotes a length of the flat part R1 of the magnetization free layer 4 along the X-Y plane, and L2 denotes a length of the inclined part R2 of the magnetization free layer 4 along the X-Y plane. In such a case, it becomes possible to further reduce the amount of magnetization, positioned near the end surface 41, which is less likely to follow the detection target magnetic field Hs. As a result, it becomes possible to reduce the error in an output signal supplied from the magneto-resistive effect element 1.

[2. Experimental Examples]

Experimental Example 1

Figure 6A:
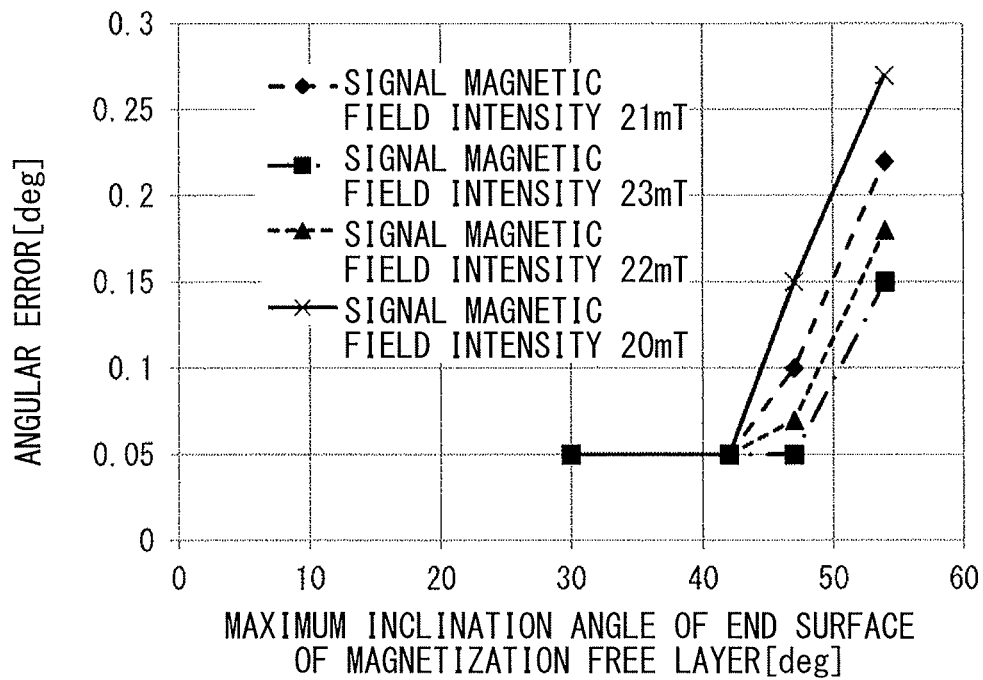
FIG. 6A is a characteristic diagram illustrating a relationship between a maximum inclination angle of an end surface and an angular error in Experimental Example 1.

Examination was conducted next, in terms of the magneto-resistive effect element 1 according to the foregoing example embodiment, on a relationship between the maximum inclination angle θ2 of the end surface 41 and an angular error of an angle of a signal magnetic field having predetermined intensity. The angular error of the angle of the signal magnetic field having predetermined intensity is to be detected upon application of the signal magnetic field to the magneto-resistive effect element 1. The results thereof are illustrated in FIG. 6A. In FIG. 6A, the horizontal axis indicates the maximum inclination angle θ2 [in unit of degree, i.e., ° ] of the end surface 41 of the magnetization free layer 4, and the vertical axis indicates an angular error [in unit of degree, i.e., ° ] of the signal magnetic field to be detected by the magneto-resistive effect element 1. In this experimental example, the examination was conducted on intensity of each of signal magnetic fields in four levels of 20 mT, 21 mT, 22 mT, and 23 mT. The maximum inclination angle θ2 of the end surface 41 was set to four levels of 30°, 42°, 47°, and 54°. The magnetization pinned layer 2 had a stacked structure of a pair of iron-cobalt (FeCo) films and a ruthenium (Ru) film interposed between the pair of Fe—Co films, for example. The thickness of the magnetization pinned layer 2 was set to 5 nm. An antiferromagnetic layer was further provided to come into contact with a surface, of the magnetization pinned layer 2, opposite to the intermediate layer 3. Magnesium oxide (MgO) was adopted as a constituent material of the intermediate layer 3, and the thickness of the intermediate layer 3 was set to 3 nm. Iron cobalt (FeCo) and nickel iron (NiFe) were each adopted as a constituent material of the magnetization free layer 4, and the thickness of the magnetization free layer 4 was set to 18 nm.

It was confirmed, as illustrated in FIG. 6A, that, when the maximum inclination angle θ2 of the end surface 41 is 42° or less, the angular error was successfully reduced, regardless of intensity of the signal magnetic field.

Experimental Example 2

Figure 6B:
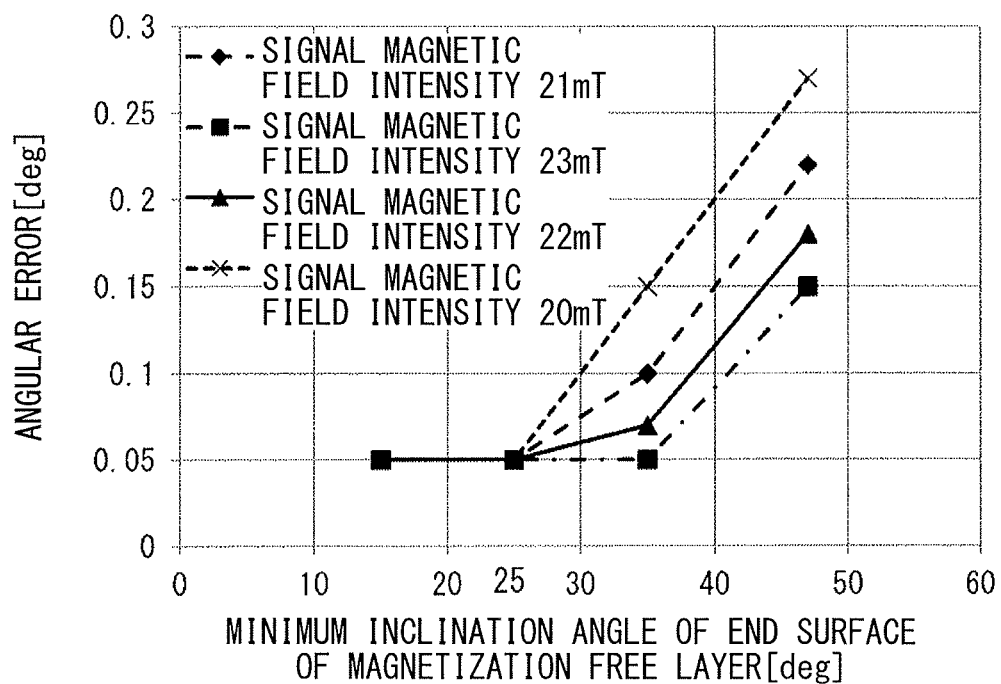
FIG. 6B is a characteristic diagram illustrating a relationship between a minimum inclination angle of an end surface and an angular error in Experimental Example 2.

Examination was conducted next, in terms of the magneto-resistive effect element 1 according to the foregoing example embodiment, on a relationship between the minimum inclination angle θ1 of the end surface 41 and an angular error of an angle of a signal magnetic field having predetermined intensity. The angular error of the angle of the signal magnetic field having predetermined intensity is to be detected upon application of the signal magnetic field to the magneto-resistive effect element 1. The results thereof are illustrated in FIG. 6B. In FIG. 6B, the horizontal axis indicates the minimum inclination angle θ1 [in unit of degree, i.e., ° ] of the end surface 41 of the magnetization free layer 4, and the vertical axis indicates an angular error [in unit of degree, i.e., ° ] of the signal magnetic field to be detected by the magneto-resistive effect element 1. In this experimental example, experimental conditions were set similar to those of the above-described Experimental Example 1.

It was confirmed, as illustrated in FIG. 6B, that, when the minimum inclination angle θ1 of the end surface 41 is 25° or less, the angular error was successfully reduced, regardless of intensity of the signal magnetic field.

Experimental Example 3

Figure 7A:
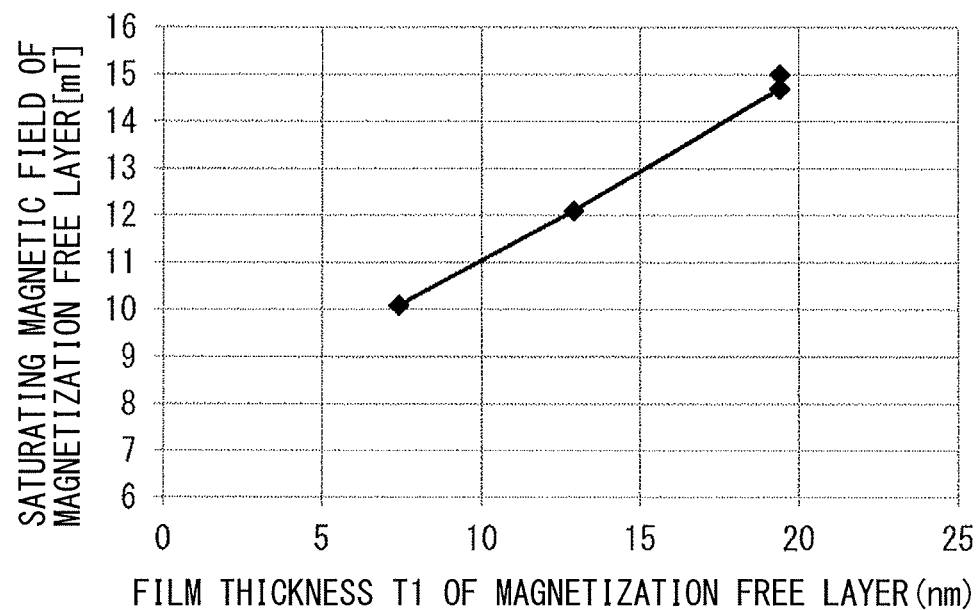
FIG. 7A is a characteristic diagram illustrating a relationship between a film thickness of a magnetization free layer and a saturating magnetic field of the magnetization free layer in Experimental Example 3.

Examination was conducted next, in terms of the magneto-resistive effect element 1 according to the foregoing example embodiment, on a relationship between the thickness T1 [in unit of nm] of the magnetization free layer 4 and a saturating magnetic field [in unit of mT] of the magnetization free layer 4. The results thereof are illustrated in FIG. 7A. In FIG. 7A, the horizontal axis indicates the thickness T1 [in unit of nm] of the magnetization free layer 4, and the vertical axis indicates the saturating magnetic field [in unit of mT] of the magnetization free layer 4. In this experimental example, the maximum inclination angle θ2 of the end surface 41 was set to 31°; the minimum inclination angle θ1 of the end surface 41 was set to 16°; and the thickness T1 was set to 7 nm, 13 nm, and 19 nm. Other than these conditions, experimental conditions were set similar to those of the above-described Experimental Example 1.

It was confirmed, as illustrated in FIG. 7A, that, when the thickness T1 is 13 nm or less, the saturating magnetic field of the magnetization free layer 4 was successfully reduced to 12 mT or less.

Experimental Example 4

Figure 7B:
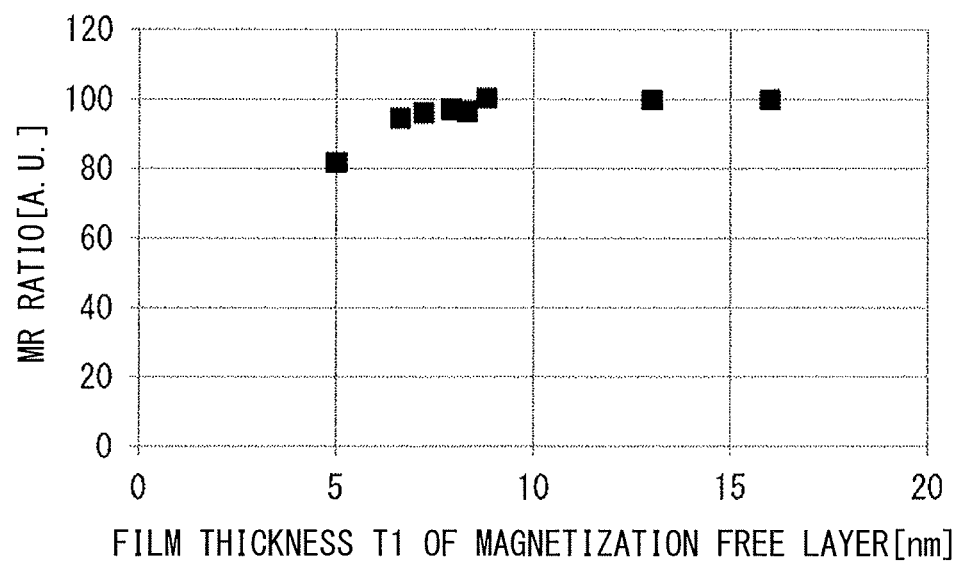
FIG. 7B is a characteristic diagram illustrating a relationship between a film thickness of a magnetization free layer and a resistance change rate of the magnetization free layer in Experimental Example 4.

Examination was conducted next, in terms of the magneto-resistive effect element 1 according to the foregoing example embodiment, on a relationship between the thickness T1 [in unit of nm] of the magnetization free layer 4 and a resistance change rate, i.e., a magneto-resistance (MR) ratio [in an arbitrary unit (A.U.)] of the magnetization free layer 4. The results thereof are illustrated in FIG. 7B. In FIG. 7B, the horizontal axis indicates the thickness T1 [in unit of nm] of the magnetization free layer 4, and the vertical axis indicates the MR ratio [in A.U.] of the magnetization free layer 4. In this experimental example, magnetostriction was set to 0. Further, the maximum inclination angle θ2 of the end surface 41 was set to 31°; the minimum inclination angle θ1 of the end surface 41 was set to 16°; and the thickness T1 was varied in a range from 5 nm to 16 nm. Other than these conditions, experimental conditions were set similar to those of the above-described Experimental Example 1. It is to be noted that the MR ratio is denoted by an arbitrary unit, provided that a value of the MR ratio is set to 100 when the thickness T1 is 16 nm.

It was confirmed, as illustrated in FIG. 7B, that, when the thickness T1 is 6 nm or more, a relatively high and stable MR ratio of the magnetization free layer 4 was obtained. It was thus found, referring to Experimental Example 3 illustrated in FIG. 7A and Experimental Example 4 illustrated in FIG. 7B, that the thickness T1 in a range from 6 nm to 13 nm makes it possible to both enhance sensitivity (i.e., the MR ratio) and reduce an output error (i.e., the saturating magnetic field), while keeping the magnetostriction low.

Experimental Example 5

Figure 7C:
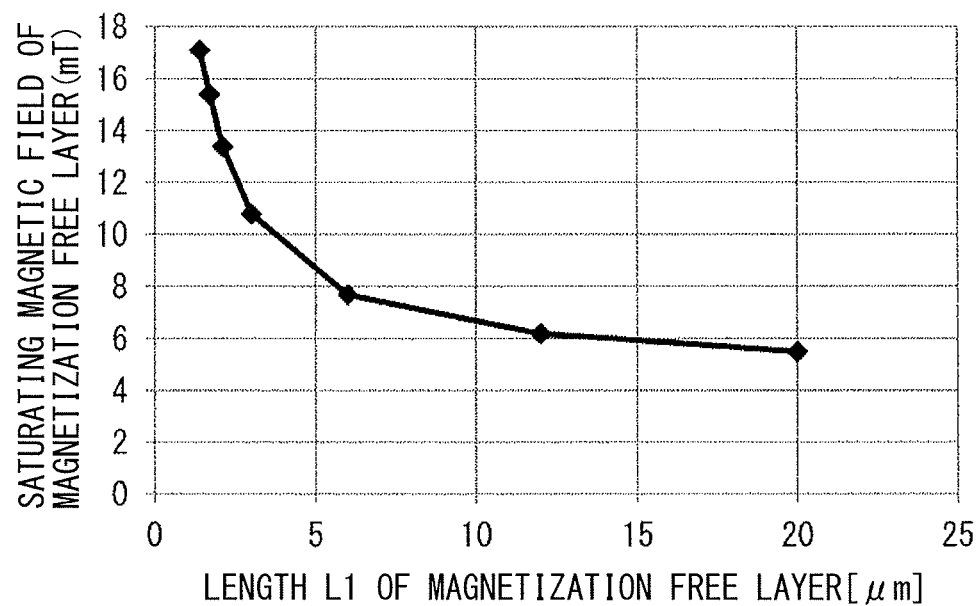
FIG. 7C is a characteristic diagram illustrating a relationship between a length of a magnetization free layer and a saturating magnetic field of the magnetization free layer in Experimental Example 5.

Examination was conducted next, in terms of the magneto-resistive effect element 1 according to the foregoing example embodiment, on a relationship between the length L1 [in unit of μm] of the magnetization free layer 4 and a saturating magnetic field [in unit of mT] of the magnetization free layer 4. The results thereof are illustrated in FIG. 7C. In FIG. 7C, the horizontal axis indicates the length L1 [in unit of μm] of the magnetization free layer 4, and the vertical axis indicates the saturating magnetic field [in unit of mT] of the magnetization free layer 4. In this experimental example, the maximum inclination angle θ2 of the end surface 41 was set to 31°; the minimum inclination angle θ1 of the end surface 41 was set to 16°; and the thickness T1 was set to 7 nm, 13 nm, and 19 nm. Other than these conditions, experimental conditions were set similar to those of the above-described Experimental Example 1.

It was confirmed, as illustrated in FIG. 7C, that, when the length L1 is 6 μm or less, the saturating magnetic field of the magnetization free layer 4 was sharply increased. The present disclosure is thus expected to have effects of controlling the maximum inclination angle θ2 of the end surface 41 and the minimum inclination angle θ1 of the end surface 41 in a case where the length L1 is 6 μm or less.

Experimental Example 6

Figure 8:
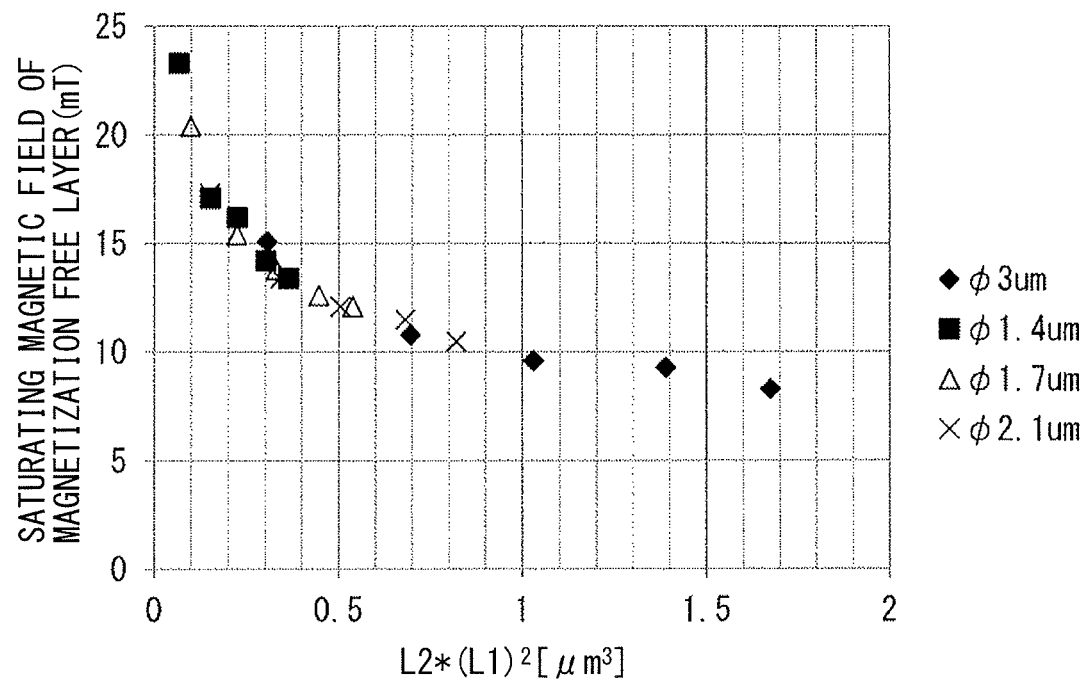
FIG. 8 is a characteristic diagram illustrating a relationship between a length of each of a flat part and an inclined part of a magnetization free layer and a saturating magnetic field of the magnetization free layer in Experimental Example 6.

Examination was conducted next, in terms of the magneto-resistive effect element 1 according to the foregoing example embodiment, on a relationship between a product [in unit of μm$^3$] of the length L2 [in unit of μm] of the magnetization free layer 4 and the length L1 [in unit of μm] of the magnetization free layer 4 and a saturating magnetic field [in unit of mT] of the magnetization free layer 4. The results thereof are illustrated in FIG. 8. In FIG. 8, the horizontal axis indicates L2*(L1)$^2$ [in unit of μm$^3$], and the vertical axis indicates the saturating magnetic field [in unit of mT] of the magnetization free layer 4. In this experimental example, the maximum inclination angle θ2 of the end surface 41 was varied in a range from 16° to 50°, and the minimum inclination angle θ1 of the end surface 41 was varied in a range from 6° to 40°. The thickness T1 was set to 7 nm, 13 nm, and 19 nm. Other than these conditions, experimental conditions were set similar to those of the above-described Experimental Example 1.

It was confirmed, as illustrated in FIG. 8, that, when L2*(L1)$^2$≥0.4 holds, the saturating magnetic field of the magnetization free layer 4 was successfully reduced to 12 mT or less.

[3. Other Modification Examples]

Figure 5:
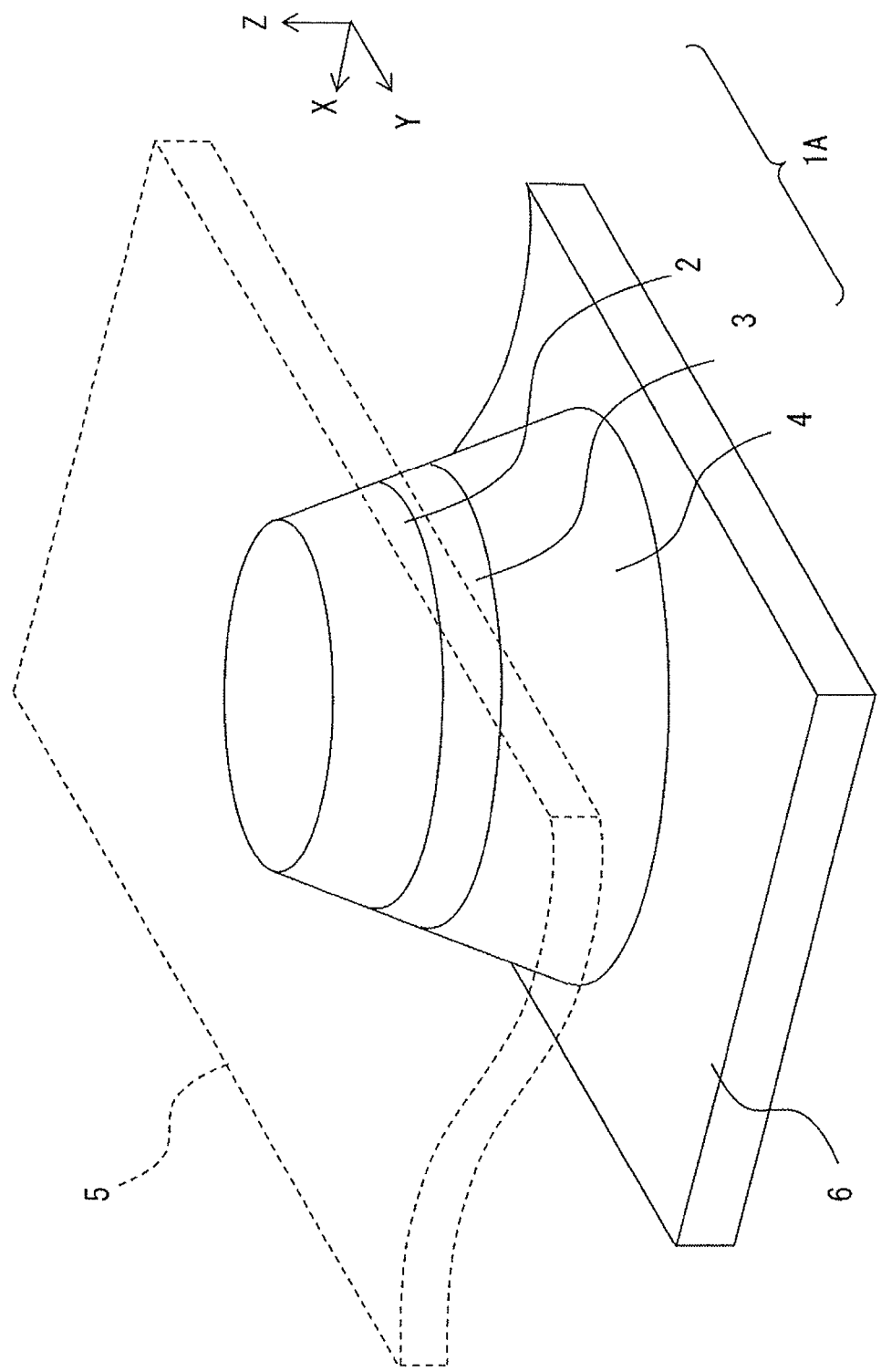
FIG. 5 is a perspective view of an overall configuration of a magneto-resistive effect device that includes a magneto-resistive effect element according to a modification example.

Although the disclosure has been described hereinabove with reference to the example embodiment, the disclosure is by no means limited to the foregoing example embodiment, and may be modified in a variety of ways. For example, the foregoing example embodiment exemplifies the magneto-resistive effect element 1 in which the magnetization pinned layer 2, the intermediate layer 3, and the magnetization free layer 4 are stacked in order on the lower electrode 6; however, the magneto-resistive effect element of the disclosure is not limited thereto. The magneto-resistive effect element of the disclosure may include a magneto-resistive effect element 1A according to a modification example illustrated in FIG. 5, for example. The magneto-resistive effect element 1A may have a configuration in which the magnetization free layer 4, the intermediate layer 3, and the magnetization pinned layer 2 are stacked in order on a base that extends along the X-Y plane, with the lower electrode 6 being interposed between the base and the magnetization free layer 4.

Moreover, the disclosure encompasses any possible combination of some or all of the various embodiments and the modification examples described herein and incorporated herein.

It is possible to achieve at least the following configurations from the above-described example embodiments of the disclosure.

(1) A magneto-resistive effect element including:
a magnetization free layer that extends along a first plane, and includes an end surface that has a maximum inclination angle of 42° or less relative to the first plane;
an intermediate layer that extends along the first plane, and is stacked on the magnetization free layer; and
a magnetization pinned layer that extends along the first plane, and is provided on side opposite to the magnetization free layer with the intermediate layer being interposed therebetween.

(2) A magneto-resistive effect element including:
a magnetization free layer that extends along a first plane, and includes an end surface that has a minimum inclination angle of 25° or less relative to the first plane;
an intermediate layer that extends along the first plane, and is stacked on the magnetization free layer; and
a magnetization pinned layer that extends along the first plane, and is provided on side opposite to the magnetization free layer with the intermediate layer being interposed therebetween.

(3) A magneto-resistive effect element including:
a magnetization free layer that extends along a first plane;
an intermediate layer that extends along the first plane, and is stacked on the magnetization free layer; and
a magnetization pinned layer that extends along the first plane, and is provided on side opposite to the magnetization free layer with the intermediate layer being interposed therebetween,
the magnetization free layer including
a flat part that has a substantially constant first thickness, and
an inclined part that includes an end surface, the inclined part having a second thickness that decreases as being away from the flat part, and
the magnetization free layer satisfying the following conditional expression (1):

$$L2*(L1)^2 \geq 0.4 \quad (1)$$

where
L1 denotes a length of the flat part of the magnetization free layer along the first plane, and
L2 denotes a length of the inclined part of the magnetization free layer along the first plane.

(4) The magneto-resistive effect element according to any one of (1) to (3), in which
the magnetization free layer further includes
a first principal surface that extends along the first plane, and faces the intermediate layer, and
a second principal surface that extends along the first plane, and is positioned on side opposite to the intermediate layer, and
the end surface includes a part positioned between a first position and a second position and being recessed from a position on a linear line that connects the first position and the second position on a second plane that is orthogonal to the first plane, the first position being a position at which the end surface and the first principal surface intersect each other, the second position being a position at which the end surface and the second principal surface intersect each other.

(5) The magneto-resistive effect element according to any one of (1) to (4), in which the intermediate layer includes a first material that is non-magnetic and electrically conductive or a second material that is non-magnetic and non-electrically conductive.

(6) The magneto-resistive effect element according to any one of (1) to (5), in which the magnetization free layer has a thickness in a range from 6 nm to 13 nm in a thickness direction that is orthogonal to the first plane.

(7) The magneto-resistive effect element according to any one of (1) to (5), in which the magnetization free layer has a length of 6 μm or less in a direction of a detection target magnetic field along the first plane.

(8) The magneto-resistive effect element according to any one of (1) to (7), in which area of the magnetization free layer along the first plane is minimum at a position closest to the intermediate layer.

(9) The magneto-resistive effect element according to (8), in which the area of the magnetization free layer along the first plane becomes smaller as being closer to the intermediate layer.

A magneto-resistive effect element according to an embodiment of the disclosure includes: a magnetization free layer that extends along a first plane; an intermediate layer that extends along the first plane, and is stacked on the magnetization free layer; and a magnetization pinned layer that extends along the first plane, and is provided on side opposite to the magnetization free layer with the intermediate layer being interposed therebetween. Here, the magnetization free layer includes an end surface that has a maximum inclination angle of 42° or less relative to the first plane.

In the magneto-resistive effect element according to one embodiment of the disclosure, the magnetization free layer includes an end surface that has a maximum inclination angle of 42° or less relative to the first plane, thus alleviating the influence of the shape anisotropy of the magnetization free layer, allowing for reduction in an amount of magnetization, positioned near the end surface, which is less likely to follow the external magnetic field.

A magneto-resistive effect element according to an embodiment of the disclosure includes: a magnetization free layer that extends along a first plane; an intermediate layer that extends along the first plane, and is stacked on the magnetization free layer; and a magnetization pinned layer that extends along the first plane, and is provided on side opposite to the magnetization free layer with the intermediate layer being interposed therebetween. Here, the magnetization free layer includes an end surface that has a minimum inclination angle of 25° or less relative to the first plane.

In the magneto-resistive effect element according to one embodiment of the disclosure, the magnetization free layer includes an end surface that has a minimum inclination angle of 25° or less relative to the first plane, thus alleviating the influence of the shape anisotropy of the magnetization free layer, allowing for reduction in the amount of the magnetization, positioned near the end surface, which is less likely to follow the external magnetic field.

A magneto-resistive effect element according to an embodiment of the disclosure includes: a magnetization free layer that extends along a first plane; an intermediate layer that extends along the first plane, and is stacked on the magnetization free layer; and a magnetization pinned layer that extends along the first plane, and is provided on side opposite to the magnetization free layer with the intermediate layer being interposed therebetween. Here, the magnetization free layer includes a flat part that has a substantially constant first thickness, and an inclined part including an end surface and having a second thickness that decreases as being away from the flat part. The magnetization free layer satisfies the following conditional expression (1).

$$L2*(L1)^2 \geq 0.4 \quad (1)$$

where L1 denotes a length of the flat part of the magnetization free layer along the first plane, and L2 denotes a length of the inclined part of the magnetization free layer along the first plane.

In the magneto-resistive effect element according to one embodiment of the disclosure, the conditional expression (1) is satisfied, thus alleviating the influence of the shape anisotropy of the magnetization free layer, allowing for reduction in the amount of the magnetization, positioned near the end surface, which is less likely to follow the external magnetic field.

A magneto-resistive effect element according to an embodiment of the disclosure includes: a magnetization free layer that extends along a first plane; an intermediate layer that extends along the first plane, and is stacked on the magnetization free layer; a magnetization pinned layer that extends along the first plane, and is provided on side opposite to the magnetization free layer with the intermediate layer being interposed therebetween. Here, area of the magnetization free layer along the first plane is minimum at a position closest to the intermediate layer.

In the magneto-resistive effect element according to one embodiment of the disclosure, area of the magnetization free layer along the first plane is minimum at a position closest to the intermediate layer, thus making it possible to keep the magnetization, positioned near the end surface, which is less likely to follow the external magnetic field away from the intermediate layer.

According to the magneto-resistive effect element of one embodiment of the disclosure, it is possible to suppress the influence of the shape anisotropy of the magnetization free layer, and thus to achieve a lower saturating magnetic field in the magnetization free layer. It is to be noted that effects of the disclosure are not limited thereto, and may be any effects as described hereinabove.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A magneto-resistive effect element comprising:
a magnetization free layer that extends along a first plane;
an intermediate layer that extends along the first plane; and
a magnetization pinned layer that extends along the first plane, and is provided on a side opposite to the magnetization free layer with the intermediate layer being interposed therebetween,
the magnetization free layer including:
a flat part that has a substantially constant first thickness, and
an inclined part that includes an end surface, the inclined part having a second thickness that decreases as being away from the flat part, and
the magnetization free layer satisfying the following conditional expression (1):

$$L2*(L1)^2 \geq 0.4 \, \mu m^3 \text{ (cubic micrometers)} \quad (1)$$

where:
L1 denotes a length in μm (micrometers) of the flat part of the magnetization free layer along the first plane, and
L2 denotes a length in μm (micrometers) of the inclined part of the magnetization free layer along the first plane.

2. A magneto-resistive effect element comprising:
a magnetization free layer that extends along a first plane, and includes an end surface that has a maximum inclination angle of 42° or less relative to the first plane;
an intermediate layer that extends along the first plane; and
a magnetization pinned layer that extends along the first plane, and is provided on a side opposite to the magnetization free layer with the intermediate layer being interposed therebetween,
wherein:
the magnetization free layer further includes:
a first principal surface that extends along the first plane, and faces the intermediate layer, and
a second principal surface that extends along the first plane, and is positioned on a side opposite of the intermediate layer, and
the end surface includes a part that is positioned between a first position and a second position on a second plane that is orthogonal to the first plane, the first position being a position at which the end surface and the first principal surface intersect each other, the second position being a position at which the end surface and the second principal surface intersect each other.

3. A magneto-resistive effect element comprising:
a magnetization free layer that extends along a first plane, and includes an end surface that has a minimum inclination angle of 25° or less relative to the first plane;
an intermediate layer that extends along the first plane; and
a magnetization pinned layer that extends along the first plane, and is provided on a side opposite to the magnetization free layer with the intermediate layer being interposed therebetween,
wherein:
the magnetization free layer further includes:
a first principal surface that extends along the first plane, and faces the intermediate layer, and
a second principal surface that extends along the first plane, and is positioned on a side opposite of the intermediate layer, and the end surface includes a part that is positioned between a first position and a second position and is recessed from a position on a linear line that connects the first position and the second position on a second plane that is orthogonal to the first plane, the first position being a position at which the end surface and the first principal surface intersect each other, the second position being a position at which the end surface and the second principal surface intersect each other.

4. The magneto-resistive effect element according to claim 1, wherein:
the magnetization free layer further includes:
first principal surface that extends along the first plane, and faces the intermediate layer, and
a second principal surface that extends along the first plane, and is positioned on a side opposite to the intermediate layer, and
the end surface includes a part that is positioned between a first position and a second position and is recessed from a position on a linear line that connects the first position and the second position on a second plane that is orthogonal to the first plane, the first position being a position at which the end surface and the first principal surface intersect each other, the second position being a position at which the end surface and the second principal surface intersect each other.

5. The magneto-resistive effect element according to claim 2, wherein the intermediate layer includes a first material that is non-magnetic and electrically conductive or a second material that is non-magnetic and non-electrically conductive.

6. The magneto-resistive effect element according to claim 2, wherein the magnetization free layer has a thickness in a range from 6 nm (nanometers) to 13 nm in a thickness direction that is orthogonal to the first plane.

7. The magneto-resistive effect element according to claim 2, wherein the magnetization free layer has a length of 6 µm or less in a direction of a detection target magnetic field along the first plane.

8. The magneto-resistive effect element according to claim 2, wherein an area of the magnetization free layer along the first plane is a minimum at a position closest to the intermediate layer.

9. The magneto-resistive effect element according to claim 8, wherein the area of the magnetization free layer along the first plane decreases along a direction toward the intermediate layer.

* * * * *